(12) United States Patent
Weale et al.

(10) Patent No.: US 11,049,792 B1
(45) Date of Patent: Jun. 29, 2021

(54) PACKAGE STRUCTURE FOR SEMICONDUCTOR DEVICES

(71) Applicant: SEMICONDUCTOR COMPONENTS INDUSTRIES, LLC, Phoenix, AZ (US)

(72) Inventors: Gareth Pryce Weale, New Hamburg (CA); Joseph Steffler, Waterloo (CA); Yik Yee Tan, Melaka (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/929,498

(22) Filed: May 6, 2020

(51) Int. Cl.
| | | |
|---|---|---|
| H01L 23/373 | (2006.01) |
| H01L 21/48 | (2006.01) |
| H01L 21/56 | (2006.01) |
| H01L 23/367 | (2006.01) |
| H01L 23/31 | (2006.01) |

(52) U.S. Cl.
CPC ...... *H01L 23/3735* (2013.01); *H01L 21/4875* (2013.01); *H01L 21/56* (2013.01); *H01L 23/3121* (2013.01); *H01L 23/367* (2013.01); *H01L 23/3731* (2013.01)

(58) Field of Classification Search
CPC combination set(s) only.
See application file for complete search history.

(56) References Cited

U.S. PATENT DOCUMENTS

| | | | |
|---|---|---|---|
| 10,923,435 B2 * | 2/2021 | Tsai | H01L 23/36 |
| 2002/0163070 A1 | 11/2002 | Choi | |
| 2010/0001906 A1 | 1/2010 | Akkermans et al. | |
| 2010/0127299 A1 * | 5/2010 | Smith | F21K 9/00 257/99 |
| 2012/0106086 A1 * | 5/2012 | Schloerke | H01L 23/24 361/715 |
| 2013/0322023 A1 * | 12/2013 | Kim | H01L 23/4334 361/720 |
| 2015/0021754 A1 * | 1/2015 | Lin | H01L 23/5389 257/712 |
| 2015/0235933 A1 | 8/2015 | Ladhani et al. | |
| 2017/0345735 A1 * | 11/2017 | Yang | H01L 25/0655 |
| 2019/0393193 A1 * | 12/2019 | Eid | H01L 23/373 |
| 2020/0260609 A1 * | 8/2020 | Saha | H01L 23/42 |

\* cited by examiner

*Primary Examiner* — Douglas W Owens
(74) *Attorney, Agent, or Firm* — Brake Hughes Bellermann LLP

(57) ABSTRACT

A semiconductor device package includes a heatsink platform, with a ceramic isolation layer bonded to the heatsink platform. A semiconductor die may be disposed on the ceramic isolation layer, with mold material disposed on the ceramic isolation layer and surrounding at least a portion of the semiconductor die. A redistribution layer may be disposed on the semiconductor die and the mold material. Such packages, and similar, enable the use of a thin, inexpensive device substrate, while providing an efficient thermal path to the heatsink platform, while the redistribution layer enables electrical connections that are short, low-resistance, low-inductance, and low-loss connections.

19 Claims, 10 Drawing Sheets

US 11,049,792 B1

PACKAGE STRUCTURE FOR SEMICONDUCTOR DEVICES

TECHNICAL FIELD

This description relates to semiconductor device packaging.

BACKGROUND

Various types of semiconductor devices may operate over wide ranges of power and frequency. Semiconductor device packages may be constructed in manners that take these operating ranges into account, while also considering operational environments into which the packaged semiconductor devices will be deployed. Such packages are also subject to other considerations, such as cost and reliability.

Consequently, it is difficult to provide semiconductor device packages which optimize or balance such competing factors effectively. For example, a package with desired thermal properties may be too large for a desired operational environment. Moreover, packaging optimized for a particular type of semiconductor device may be unsuitable for other types of semiconductor devices.

SUMMARY

According to one general aspect, a semiconductor device package includes a heatsink platform, a ceramic isolation layer bonded to the heatsink platform, and a semiconductor die disposed on the ceramic isolation layer. The semiconductor device package further includes mold material disposed on the ceramic isolation layer and surrounding at least a portion of the semiconductor die, and a redistribution layer disposed on the semiconductor die and the mold material.

According to another general aspect, a semiconductor device package includes a heatsink platform, an isolation layer disposed on the heatsink platform, and a semiconductor die disposed on the isolation layer. A mold material may be disposed on the isolation layer and surrounding the semiconductor die with a cavity between the mold material and the semiconductor die. A redistribution layer may be disposed on the semiconductor die and the mold material, and including metallization connecting the semiconductor die to an external solder connection.

According to another general aspect, a method of making a semiconductor device package may include bonding a ceramic isolation layer to a heatsink platform, and disposing a semiconductor die on the ceramic isolation layer. The method may further include forming a mold material surrounding the semiconductor die, and forming a redistribution layer on the semiconductor die and the mold material.

The details of one or more implementations are set forth in the accompanying drawings and the description below. Other features will be apparent from the description and drawings, and from the claims.

DETAILED DESCRIPTION

Example semiconductor device packages and associated manufacturing techniques are described that provide high power, high frequency performance, while also enabling construction at low cost and with relatively small package sizes. Described semiconductor packages may be produced in high volume, large scale operations. Moreover, the described semiconductor packages may be used with a wide variety of different types and combinations of semiconductor devices.

As described in detail below, described semiconductor packages enable the use of a thin, inexpensive device substrate (such as Silicon (Si)), while providing an efficient thermal path between the semiconductor device(s) formed using the substrate and an attached heatsink. Consequently, the described packages are suitable for high power devices, even for semiconductor devices that are small and have a high power density, such as a Gallium Nitride (GaN) transistor, a Gallium Arsenide (GaAs) transistor, an Indium Phosphide (InP) transistor, Silicon MOSFET, LDMOS (Laterally Diffused MOSFET), and other technologies.

Further, a redistribution layer enables electrical connections to the semiconductor device(s) that are short, low-resistance, low-inductance, and low-loss connections. As a result, the described packages are highly suitable for high frequency, e.g., radio frequency (RF), devices.

Additionally, the described semiconductor packages may be formed using bulk sheets or panels of heatsink material, such as Copper (Cu) or a suitable Cu alloy. An isolating and insulating layer may be added to the heatsink panel, and then a large number of semiconductor devices may be placed on the isolating and insulating layer (including different types of semiconductor devices) and packaged, and then singulated to obtain individually isolated and packaged devices. Accordingly, the described manufacturing techniques are cost-effective and suitable for high volume, large scale production.

Figure 1:
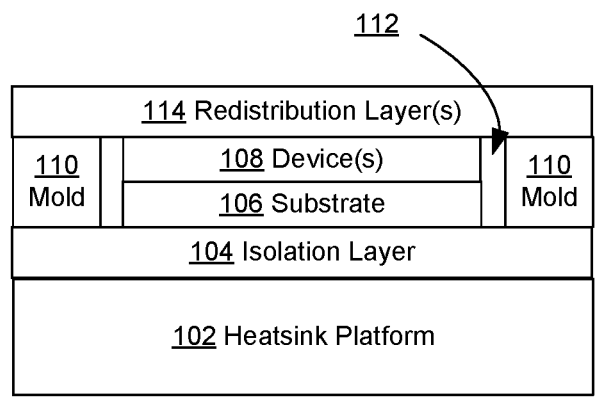
FIG. 1 is a cross section of an example implementation of a semiconductor device package.

FIG. 1 is a cross section of an example implementation of a semiconductor device package. FIG. 1 illustrates example cross-sectional layers of a semiconductor device package, and should not be interpreted as being drawn to scale.

In the example of FIG. 1, a heatsink platform 102 may be implemented using Cu, a suitable Cu alloy, or any suitable heatsink material. An isolation layer 104 may be bonded, e.g., laminated, to a surface of the heatsink platform 102. For example, the isolation layer 104 may be implemented as a ceramic layer.

Figure 2:
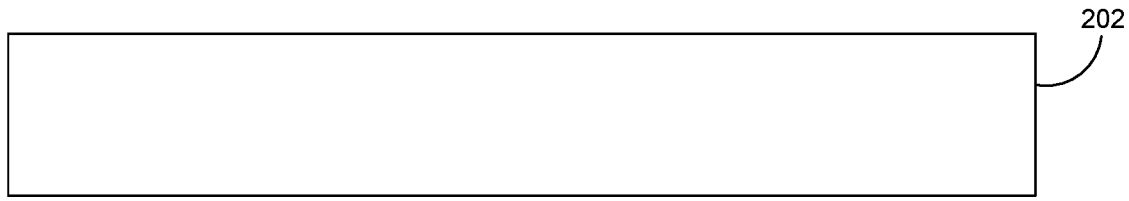
FIG. 2 is a cross-section of a first example process stage for forming the example implementation of FIG. 1.

As referenced above, the heatsink platform 102 may be diced, cut, or otherwise obtained from a bulk sheet or panel (such as a panel 202, as shown and described in FIG. 2). Accordingly, the isolation layer 104 may similarly be cut from a sheet of isolation material (e.g., ceramic) that is bonded to some or all of a surface of the bulk heatsink sheet/panel (such as a ceramic layer 302, as shown and described in FIG. 3).

In FIG. 1, a substrate 106 represents a thin substrate layer that is mounted or disposed on the isolation layer 104. As described in detail, below, the isolation layer 104 electrically insulates and isolates the substrate 106 and one or more semiconductor devices, illustrated in FIG. 1 as a semiconductor device 108, disposed thereon from the heatsink platform 102. The isolation layer 104 also provides an efficient thermal path for heat dissipation of heat generated by the semiconductor device 108.

By using suitably thin substrate 106, efficient and effective heat transfer from the semiconductor device 108 to the heatsink platform 102 may be obtained, even for devices with high power output and/or high power density. Moreover, as referenced, inexpensive substrate materials, such as Si, may be used. Example techniques for obtaining and using suitably thin substrate 106 are described below, e.g., with respect to FIGS. 4 and 12.

Mold material 110 represents any suitable molding material, such as a mold compound, including epoxy molding compound(s) (EMC). In the example of FIG. 1, the mold material 110 is surrounding at least a portion of the semiconductor die that includes the substrate 106 and the semiconductor device(s) 108, with a cavity 112 in between.

In some implementations, the cavity 112 may be air-filled, or filled with nitrogen or another inert gas. A size, shape, and dimensions of the cavity 112 may be dependent upon relative and absolute sizes of the semiconductor devices 108, the substrate 106, and the mold material 110.

Figure 9:
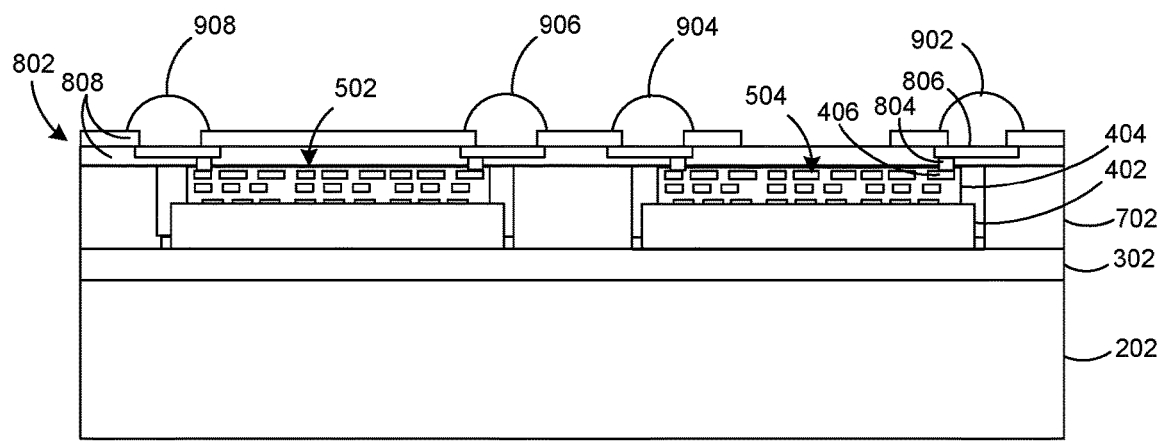
FIG. 9 is a cross-section of an eighth example process stage for forming the example implementation of FIG. 1.

The mold material 110 may represent constructional grade mold compounds suitable for supporting a redistribution layer (RDL) 114. As illustrated and described below, the RDL 114 represents one or more layers of metallization (e.g., Cu metallization) that enable electrical connections between the semiconductor device 108 (e.g., input/output pads of the semiconductor device 108) and other devices that are external to the semiconductor device package of FIG. 1. For example, as shown in FIG. 9, the RDL 114 may facilitate connection between the semiconductor device 108 and external solder connections, such as solder bumps or solder balls, which may then be used in subsequent external connections outside of the semiconductor device package of FIG. 1.

Figure 10:
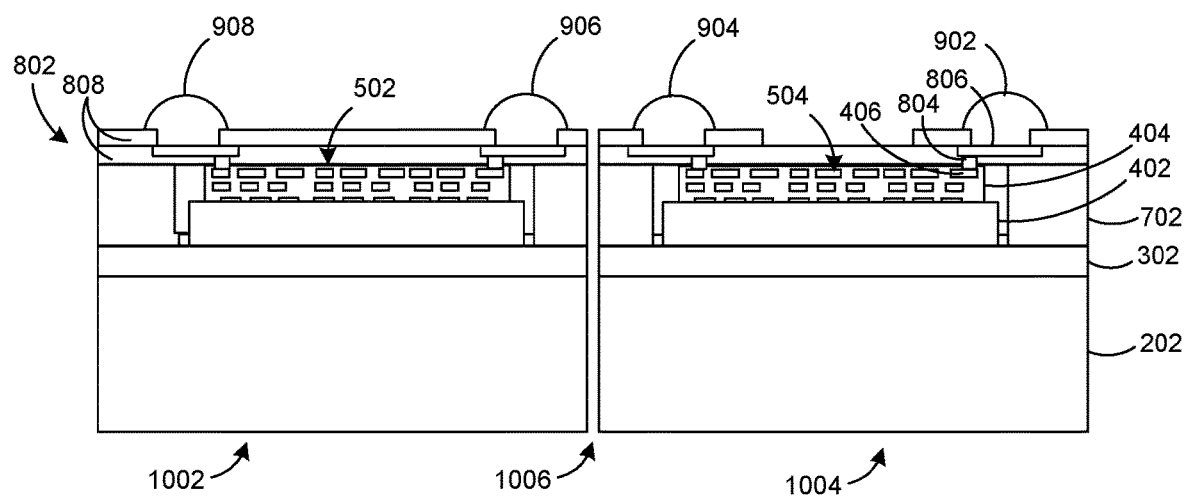
FIG. 10 is a cross-section of a ninth example process stage for forming the example implementation of FIG. 1.
Figure 11:
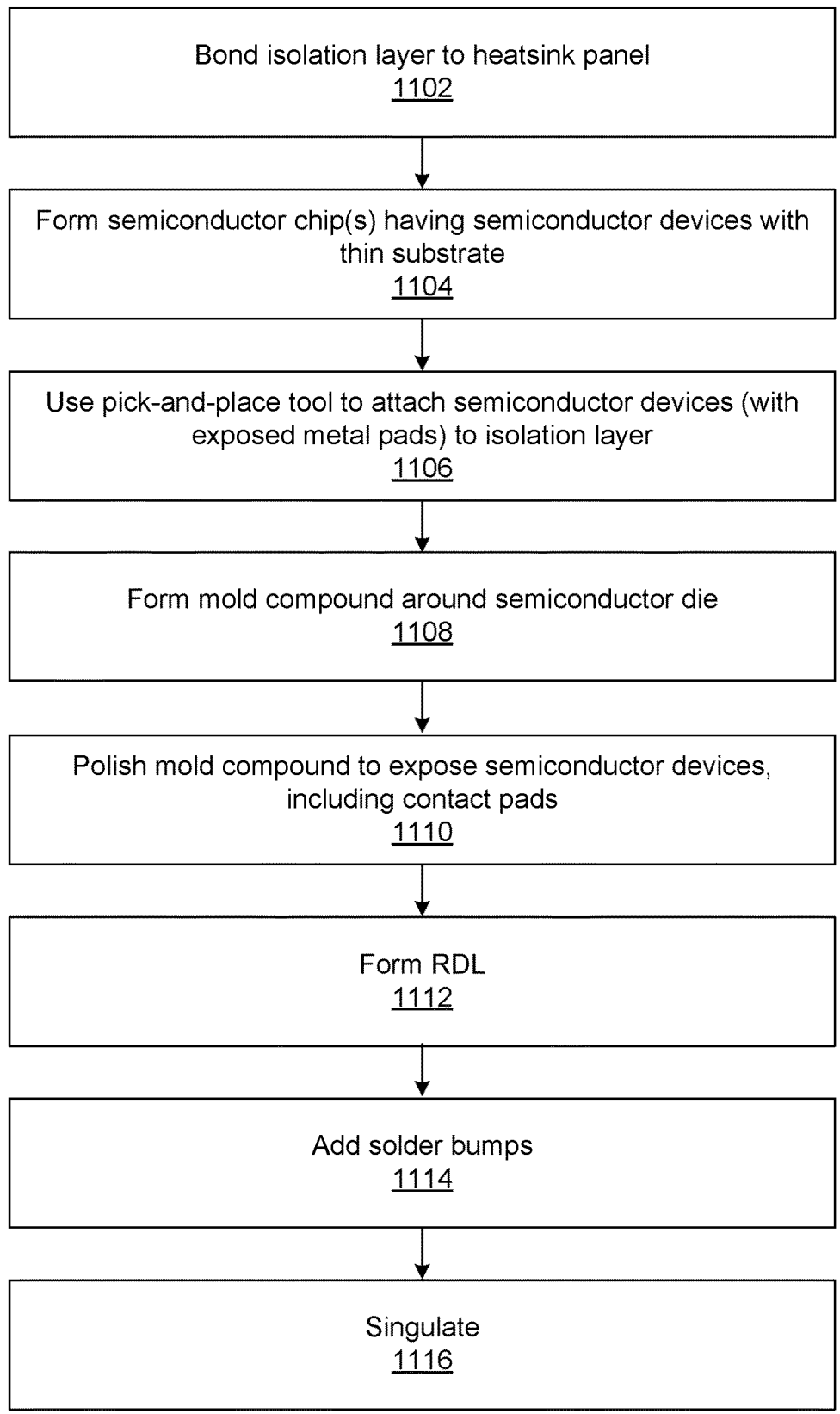
FIG. 11 is a flowchart illustrating example process steps corresponding to the examples of FIGS. 2-10.

FIGS. 2-10 illustrate example process steps of an assembly flow for constructing example instances of the semiconductor package of FIG. 1, with reference to a process flow illustrated in the flowchart of FIG. 11. In the described examples, as referenced above, techniques are provided for manufacturing implementations of FIG. 1 in large-scale, high-volume, cost-effective operations. However, other techniques may be used for more specialized manufacturing, some examples of which are illustrated and described below.

Figure 3:
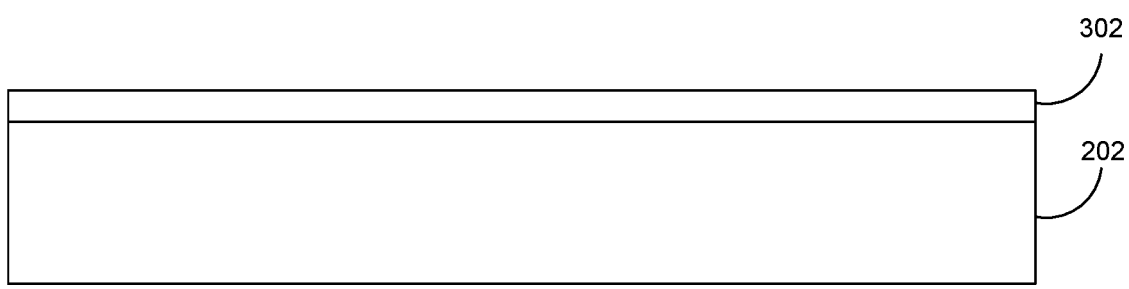
FIG. 3 is a cross-section of a second example process stage for forming the example implementation of FIG. 1.

As referenced above, FIG. 2 illustrates a heatsink panel 202, which may include Cu, a Cu alloy, or other suitable material. As shown in FIG. 3, and referenced in FIG. 11, an isolation layer 302 may be bonded to the heatsink panel 202 (1102). For example, the isolation layer 302 may be implemented as a ceramic plate, panel, or other layer bonded to the heatsink panel 202.

A size and other properties or aspects of example heatsink panels and ceramic panels may depend on requirements of a final assembly, some of which are referenced below. For example, example panels 202, 302 may be implemented as square/rectangular panels with suitable dimensions, e.g., 6×8 inches, or 6 inches square. Parameters or properties of the ceramic material chosen for the isolation layer 302 may be selected based on desired aspects of RF performance to be included in the final package being constructed. For example, the ceramic material may be chosen with frequency response characteristics that match frequency characteristics of the device (e.g., device 108 of FIG. 1), e.g., an RF transistor. Example ceramic or ceramic-like materials include, but are not limited to, aluminum nitride (alumina), silicates, silicon nitride, zirconias and other materials such as magneto dielectrics. Example parameters that define or contribute to thermal and RF operation include thermal conductivity, expansion coefficients, epsilon, loss factor, and permeability.

Figure 4:
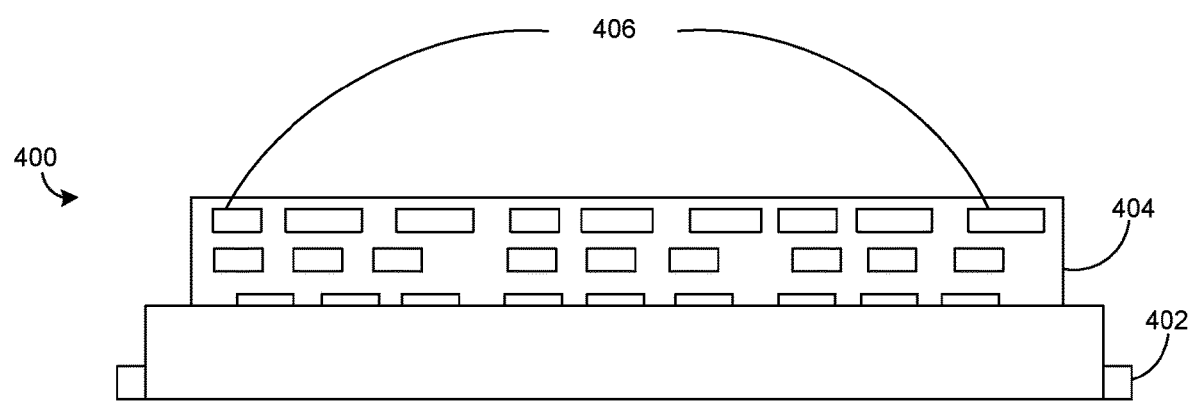
FIG. 4 is a cross-section of a third example process stage for forming the example implementation of FIG. 1.

FIG. 4 illustrates formation of a semiconductor die 400 with semiconductor device(s) 404 with a relatively thin substrate 402 (1104). Multiple techniques may be used to form the thin substrate 402. For example, wafer grinding techniques (e.g., backgrinding) may be used. More specific example techniques are provided below, in the example of FIG. 12

By using relatively thin substrates, efficient thermal transfer may occur between the example semiconductor devices 404 and the isolation layer 302, and ultimately to the heatsink material 202. Moreover, the substrate 402 may be implemented using inexpensive materials, such as Silicon, for a wide variety of semiconductor devices 404. For example, for large-scale processing as described herein, large Si wafers, e.g., 12 inch wafers, may be used.

In FIG. 4, semiconductor devices 404 are illustrated generically and represent many different types of devices that may be included. For example, laterally-diffused metal-oxide-semiconductor (LDMOS) devices may be implemented, or Gallium Nitride (GaN) transistors. In the latter case, the techniques described herein enable the use of Si in the place of otherwise expensive and/or difficult-to-manufacture substrates that may also be used for GaN transistors, such as Silicon Carbide, bulk GaN, Sapphire, or Diamond. For example, use of the thinned Si substrates described herein, in conjunction with ceramic isolation layers bonded to a Cu-based heatsink platform, enable advantageous thermal relief paths while ensuring necessary levels of electrical isolation.

Finally in FIG. 4, bonding pads 406 are shown for providing input/output connections to the semiconductor devices 404. As referenced above with respect to FIG. 1, and illustrated and described in detail, below, the described techniques enable shorter RF paths to the bonding pads 406 from external circuits, enabling low impedance, low inductance, and high bandwidth for RF applications.

Figure 5:
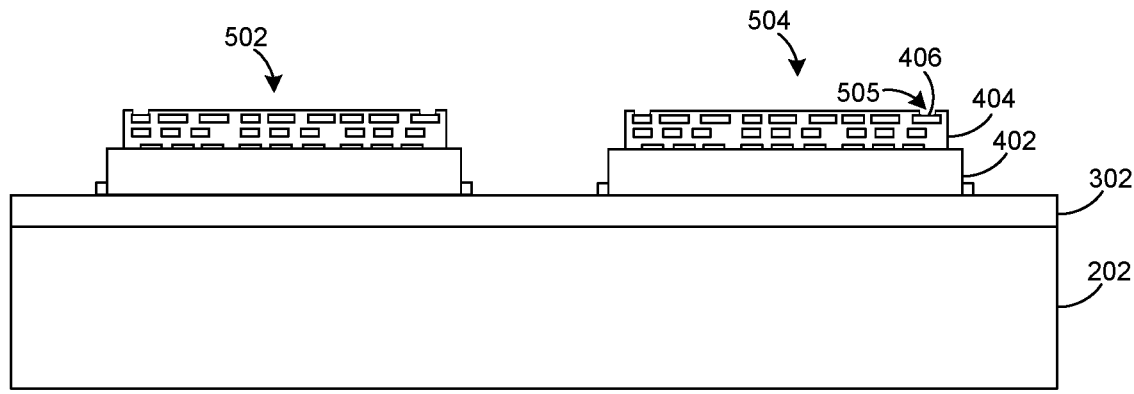
FIG. 5 is a cross-section of a fourth example process stage for forming the example implementation of FIG. 1.

Then, as shown in FIG. 5, multiple die 502, 504 of the semiconductor die 400 of FIG. 4 may be mounted onto the isolation layer 302. For example, a pick-and-place tool may be used to attach semiconductor devices 502, 504 to the isolation layer 302 (1106). Mounting may occur using any suitable technique, such as thermal epoxy or any suitable type of sintering. As shown, the bonding pads (e.g., 406) may be exposed to provide metal contact 505.

In FIG. 5 only the two semiconductor dies 502, 504 are illustrated in cross section, but it will be appreciated that a surface area of the isolation layer 302 may be maximized relative to the sizes of the semiconductor dies 502, 504. Similarly, although the semiconductor dies 502, 504 are illustrated as identical devices, different devices may be included for mounting to the isolation layer 302, as illustrated and described in more detail below with respect to FIG. 14.

Figure 6:
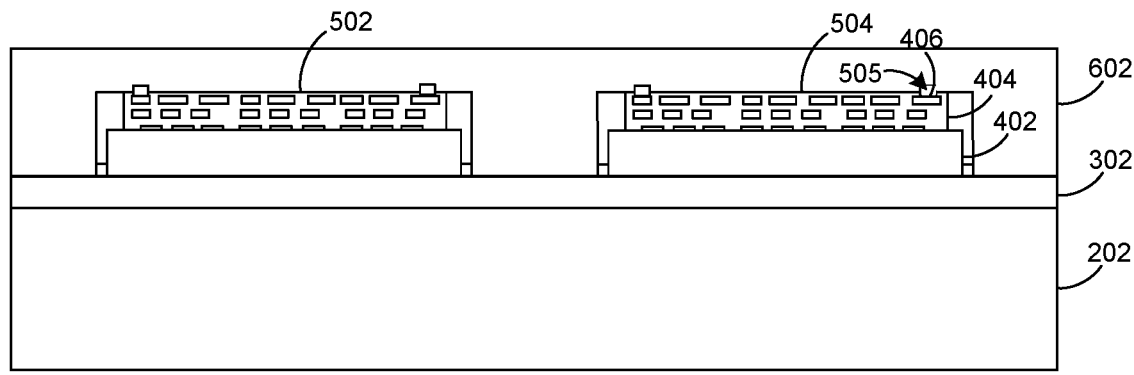
FIG. 6 is a cross-section of a fifth example process stage for forming the example implementation of FIG. 1.

In FIG. 6, mold compound 602 may be formed around the semiconductor die (1108). As referenced above, the mold compound 602 may be formed of a constructional grade mold compound suitable for supporting a redistribution layer(s).

Figure 7:
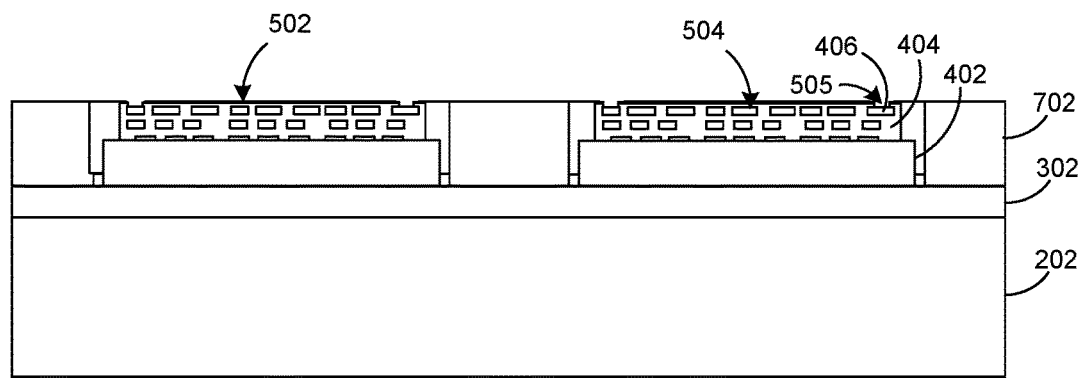
FIG. 7 is a cross-section of a sixth example process stage for forming the example implementation of FIG. 1.

In FIG. 7, the mold compound 602 is polished down to a level to expose the semiconductor die 502, 504, including exposing the metal contact 505 of the bonding pad(s) 406 (1110). For example, a first, mechanical polish may be performed to reduce the surface level of the mold compound 602 to be substantially even with a surface of the semiconductor die 502, 504, illustrated by remaining mold compound 702. Then, a second, chemical polish may be performed to clean out and expose the metal contact 505 of the bonding pads 406.

Figure 8:
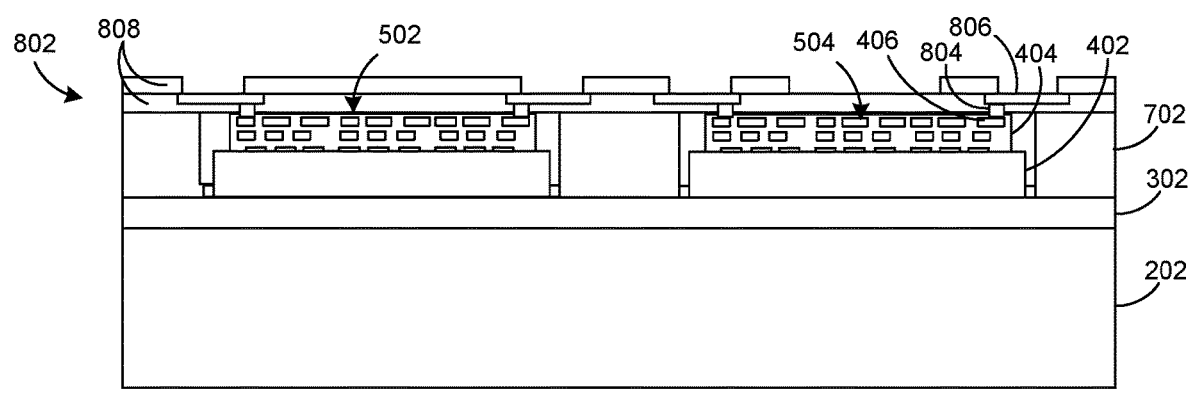
FIG. 8 is a cross-section of a seventh example process stage for forming the example implementation of FIG. 1.

In FIG. 8, the RDL 802 may then be formed (1112). As shown in FIG. 8, the RDL 802 may include copper or other suitable metallization 804, 806 to connect with bonding pad(s) 406. The RDL may include a series of metal layers including three levels of metal, with dielectric material 808 between the metal layers, as needed. For example, various mask layers may be used to form metal layer(s), the metal layers may be etched, dielectric may be deposited in the etched metal, and this process may be repeated as needed for the desired number of layers and RDL levels.

In FIG. 9, solder bumps 902, 904, 906, 908 are added (1114). Advantageously, the solder bumps 902-908 may be added at the panel level.

In FIG. 10, singulation may proceed (1116). As shown, individual, isolated, packaged die 1002, 1004 may be obtained by cutting down a panel street corresponding to division 1006.

As referenced above, in various implementations the semiconductor devices 404 may include RF transistors, such as RF GaN or RF LDMOS transistors. As shown and described, electrical connection to such high frequency transistors, and related devices, may occur through the solder bumps 902-908 and the RDL 802, resulting in a short connection with low resistance, low inductance, and low loss, as compared, for example, to packages using wire bonds.

Figure 12:
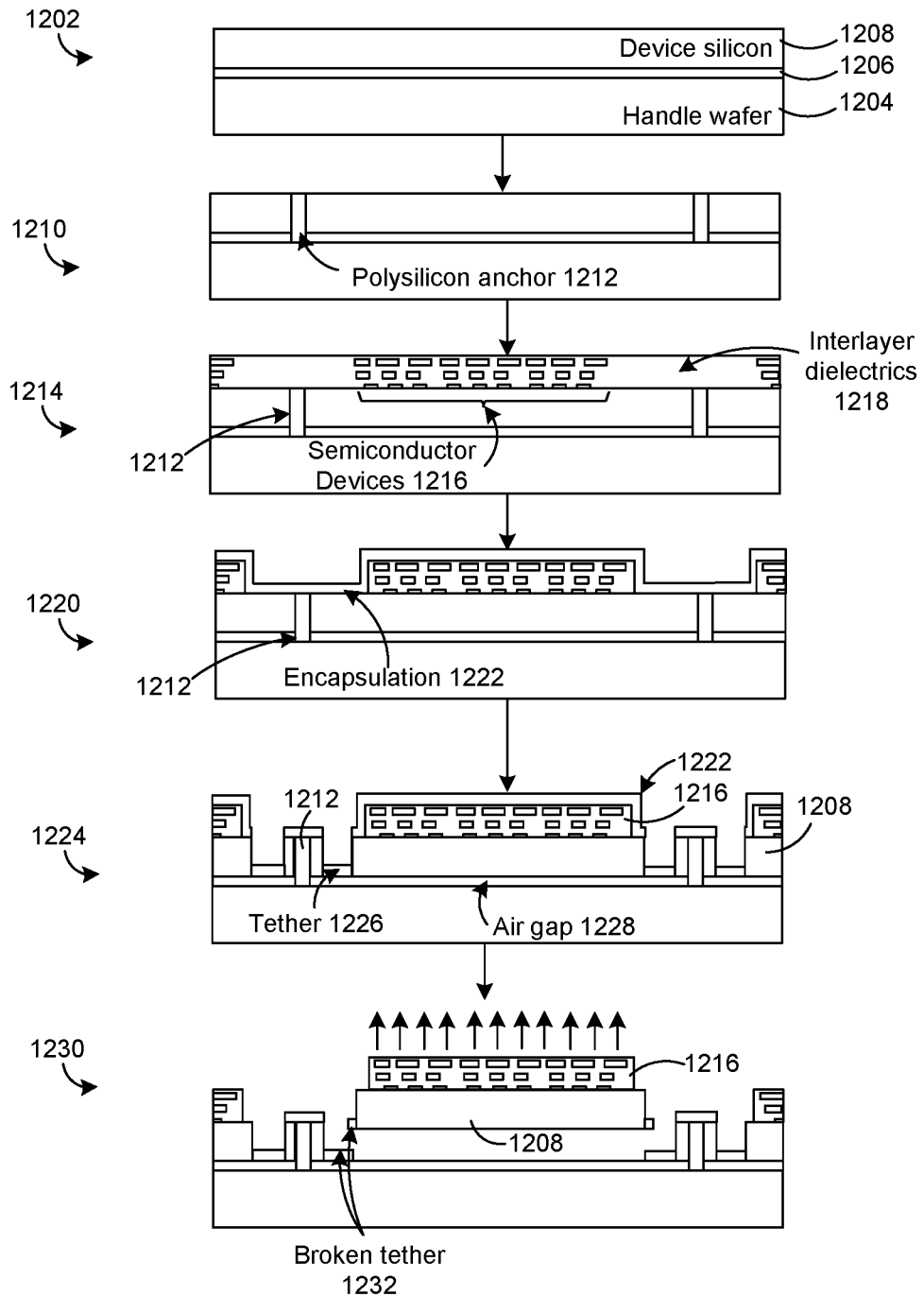
FIG. 12 illustrates an alternate example of the process stage of FIG. 4.

FIG. 12 illustrates an alternate example of the process stage of FIG. 4. That is, FIG. 12 illustrates an alternate example process for forming a semiconductor die with a suitably thin substrate.

In FIG. 12, in a process stage 1202, a Si handle or carrier wafer 1204 has a buried relief layer 1206, which may be implemented as an oxide layer, and a layer 1208 of device Si. In a process stage 1210, polysilicon anchors 1212 are formed.

In a process stage 1214, semiconductor devices 1216 are formed on the Si layer 1208, using interlayer dielectrics 1218. In a process stage 1220, an encapsulation 1222 is formed over a surface of the structure.

In a process stage 1224, etching is performed on either side of the semiconductor devices 1216, through the encapsulation 1222 and a surface of the Si layer 1208. Further, the buried oxide layer 1206 is removed to expose an air gap 1228. In this way, a tether 1226 is defined.

In a process stage 1230, the tether 1228 is broken, as illustrated by broken tether 1232, to thereby release the semiconductor die with substrate 1208 and semiconductor devices 1216. As shown, the resulting semiconductor die is similar to the example of FIG. 4.

In the example of FIG. 12, an oxide release for an active die or transistor (e.g., a Si die) is illustrated, but other implementations may use a similar process to obtain a GaN on Si design to perform a corresponding selective etch of a de-stress interface layer(s). For example, the substrate layer 1208 may include isolation or stress relief layers such as an architectural slice or epitaxial grown layer of aluminum nitride, aluminum gallium nitride, and gallium nitride, where such layers may be stacked in various thicknesses to reduce stress in the crystal lattice between Silicon and an active GaN layer.

In examples such as FIG. 12 and similar, substrate thicknesses of a few microns may be achieved, including thicknesses of 1-2 microns. Using a backgrinding process such as discussed with respect to FIG. 4, thicknesses in the range of tens of microns may be achieved, e.g., 40-50 microns. In these and similar methods, a thermal barrier from an active structure of a substrate to the opposing surface of the substrate may be suitable reduced. Further removal of the carrier can be completed by selective etching of the substrate material and also other frontside etching to selectively remove a releasing layer, similar to processes used in fields such as, e.g., micro-electromechanical system (MEMs) technology.

Figure 13:
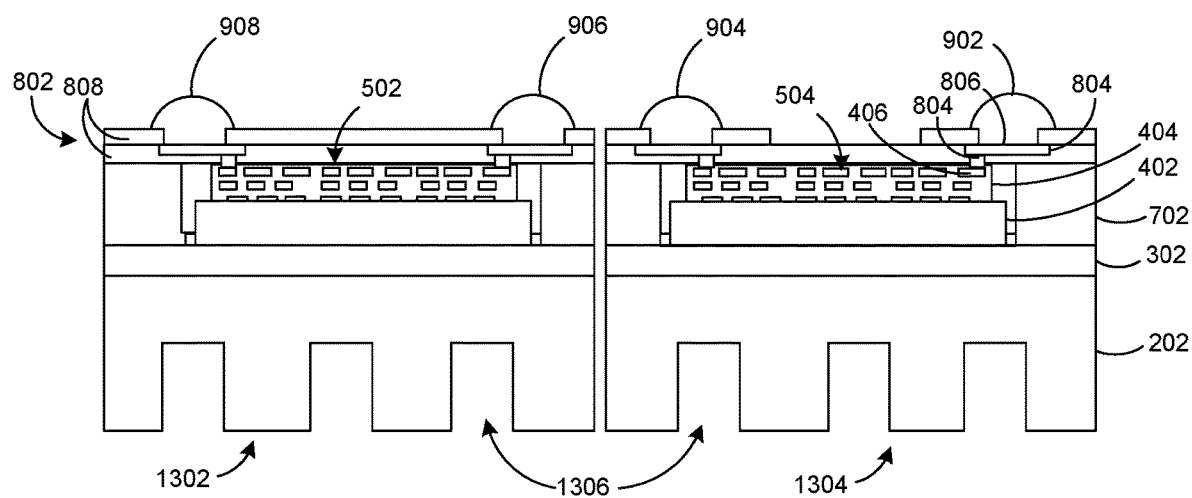
FIG. 13 is a cross section of an alternate example of the process stage of FIG. 10.

FIG. 13 is a cross section of an alternate example of the process stage of FIG. 10. In FIG. 13, separate isolated, packaged die 1302, 1304 are illustrated, each of which includes one or more grooves 1306. The grooves 1306, or strips, trenches, or other suitable structure(s), may be used to add to a surface area of the heatsink platform 202 and thereby increase an extent of available thermal relief (e.g., enhanced thermal impedance to the air). The grooves 1306 may be formed using saw cuts, etching, or other suitable techniques. As shown, the grooves are formed within a surface of the heatsink platform 202 opposed to a surface of the heatsink platform 202 on which the ceramic isolation layer 302 is bonded.

Figure 14:
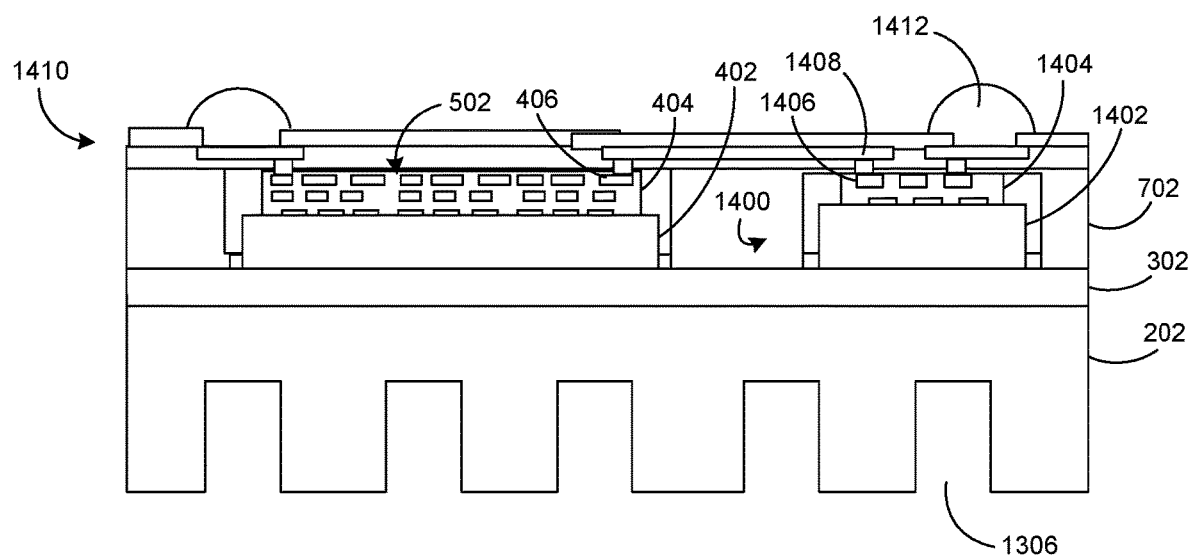
FIG. 14 is a cross section of another alternate example of the process stage of FIG. 10.

FIG. 14 is a cross section of another alternate example of the process stage of FIG. 10. FIG. 14 illustrates that multiple die may be packaged and wired together. That is, FIG. 14 illustrates that at least two semiconductor die, e.g., a first and second semiconductor die, may be mounted on a single ceramic isolation layer and surrounded by the same mold material or mold compound. The redistribution layer may be disposed on both the first and second semiconductor die and connecting the first and second semiconductor die.

For example, in FIG. 14, the semiconductor die 502 is illustrated as being packaged with a second semiconductor die 1400, which is illustrate as including a substrate 1402 and semiconductor devices 1404. A bonding pad 1406 is connected by metallization 1408 of RDL 1410 to bonding pad 406 of the semiconductor die 502. Solder bump 1412 enables connection of the semiconductor die 1400 outside of the multi-die package 1400 of FIG. 4.

The example of FIG. 14 facilitates the use of many different types of devices, heterogeneous assembly, and associated manufacturing technologies for package styles that require high thermal performance and low impedance connections to semiconductor die. For example, many power amplifiers may require a power amplifier stage, as well as a control circuit (such as a power MOSFET and a control IC, or a GaN MOSFET and a driver IC, or a modulator and a power amplifier for an RF circuit), and the structure of FIG. 14 enables a small package size, with improved thermal response and impedance matching characteristics (e.g., impedance-matched performance of gate structure(s)).

Moreover, as referenced, the approach of FIG. 14 enables combinations of devices made with heterogenous assemblies, whereby one semiconductor die is made using one technology and the other semiconductor die is made using a second technology. For example, microprocessors made in digital processes down to single nanometer gate length ranges (e.g., 4.5 nm) may be packaged with large dimension transistors, such as high voltage analog transistors.

Thus, the techniques of FIGS. 1-14 may be used to package and connect many different types of devices, and combinations thereof, including low power and high power devices. Examples include GaN MOSFETs, LDMOS, or more complicated integrated circuits, such as monolithic microwave integrated circuits (MMICs). Similarly, although the examples illustrate a single RDL, multiple RDLs may be included (e.g., a multi-layer RDL). For example, power ranges may be in the milliwatts to hundreds of watts, while example frequency ranges may include ranges from a megahertz range to hundreds of GHz, including into the hundreds of GHz for RF devices.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package, comprising:
a heatsink platform;
a ceramic isolation layer bonded to the heatsink platform;
a semiconductor die disposed on the ceramic isolation layer;
mold material disposed on the ceramic isolation layer and surrounding at least a portion of the semiconductor die; and
a redistribution layer disposed on the semiconductor die and the mold material,
wherein a frequency response characteristic of the ceramic isolation layer matches frequency characteristics of one or more devices of the semiconductor die.

2. The semiconductor device package of claim 1, wherein the heatsink platform includes copper.

3. The semiconductor device package of claim 1, wherein the heatsink platform includes grooves within a surface of the heatsink platform on an opposite side of a surface of the heatsink platform on which the ceramic isolation layer is bonded.

4. The semiconductor device package of claim 1, comprising an air cavity between the mold material and the semiconductor die.

5. The semiconductor device package of claim 1, wherein the semiconductor die includes a radio frequency transistor.

6. The semiconductor device package of claim 1, wherein the semiconductor die includes a Silicon substrate.

7. The semiconductor device package of claim 1, wherein the semiconductor die includes a GaN device on a Silicon substrate.

8. The semiconductor device package of claim 1, wherein the redistribution layer includes metallization connecting at least one bonding pad of the semiconductor die to a solder connection.

9. The semiconductor device package of claim 1, further comprising:
a second semiconductor die disposed on the ceramic isolation layer and surrounded by the mold material,
wherein the redistribution layer is disposed on the second semiconductor die and connects the semiconductor die and the second semiconductor die.

10. A semiconductor device package, comprising:
a heatsink platform;
an isolation layer disposed on the heatsink platform;
a semiconductor die disposed on the isolation layer;
a mold material disposed on the isolation layer and surrounding the semiconductor die with a cavity between the mold material and the semiconductor die; and
a redistribution layer disposed on the semiconductor die and the mold material, and including metallization connecting the semiconductor die to an external solder connection.

11. The semiconductor device package of claim 10, wherein the isolation layer includes a ceramic isolation layer.

12. The semiconductor device package of claim 10, wherein the semiconductor die includes a radio frequency transistor.

13. The semiconductor device package of claim 10, wherein the semiconductor die includes a Silicon substrate.

14. The semiconductor device package of claim 10, further comprising: a second semiconductor die disposed on the isolation layer and surrounded by the mold material, wherein the redistribution layer is disposed on the second semiconductor die and connects the semiconductor die and the second semiconductor die.

15. A method of making a semiconductor device package, comprising:
   bonding a ceramic isolation layer to a heatsink platform;
   disposing at least one semiconductor die on the ceramic isolation layer;
   forming a mold material surrounding the semiconductor die, the mold material being disposed on the isolation layer and surrounding the semiconductor die with a cavity between the mold material and the semiconductor die; and
   forming a redistribution layer on the semiconductor die and the mold material.

16. The method of claim 15, comprising:
   disposing at least two semiconductor die on the ceramic isolation layer, including the at least one semiconductor die;
   forming the mold material surrounding the at least two semiconductor die; and
   forming the redistribution layer on the at least two semiconductor die and the mold material.

17. The method of claim 16, comprising:
   cutting the ceramic isolation layer, the heatsink platform, and the mold material to singulate the at least two semiconductor die.

18. The method of claim 16, comprising:
   cutting the ceramic isolation layer, the heatsink platform, and the mold to provide the at least two semiconductor die within a single semiconductor device package.

19. The method of claim 16, comprising:
   connecting the at least two semiconductor die using the redistribution layer.

* * * * *